(12) United States Patent
Schläfli et al.

(10) Patent No.: US 11,955,958 B2
(45) Date of Patent: Apr. 9, 2024

(54) ELECTRONIC POWER SWITCH DRIVE MODULE

(71) Applicant: LEM International SA, Meyrin (CH)

(72) Inventors: Dominik Schläfli, Nyon (CH); Stephan Trombert, Leschaux (FR)

(73) Assignee: LEM International SA, Plan-les-Ouates (CH)

( * ) Notice: Subject to any disclaimer, the term of this patent is extended or adjusted under 35 U.S.C. 154(b) by 0 days.

(21) Appl. No.: 16/976,352

(22) PCT Filed: Feb. 27, 2019

(86) PCT No.: PCT/EP2019/054788
§ 371 (c)(1),
(2) Date: Aug. 27, 2020

(87) PCT Pub. No.: WO2019/166455
PCT Pub. Date: Sep. 6, 2019

(65) Prior Publication Data
US 2021/0006240 A1 Jan. 7, 2021

(30) Foreign Application Priority Data
Feb. 28, 2018 (EP) .................................... 18159316

(51) Int. Cl.
*H03K 17/082* (2006.01)
*G01R 15/18* (2006.01)
(Continued)

(52) U.S. Cl.
CPC ....... *H03K 17/0828* (2013.01); *G01R 15/181* (2013.01); *G01R 15/202* (2013.01);
(Continued)

(58) Field of Classification Search
CPC .... G01R 15/00; G01R 15/181; G01R 15/202; G01R 15/207; G01R 15/18; G01R 15/14;
(Continued)

(56) References Cited

U.S. PATENT DOCUMENTS

| 5,543,659 A | * | 8/1996 | Hosen | ................... | H02M 7/003 |
| | | | | | 257/730 |
| 2014/0112032 A1 | * | 4/2014 | Parkhou | .................. | F03D 17/00 |
| | | | | | 361/42 |

(Continued)

FOREIGN PATENT DOCUMENTS

| EP | 2157689 | 2/2010 |
| EP | 3054577 | 8/2016 |

(Continued)

OTHER PUBLICATIONS

International Search Report and Written Opinion issued by the European Patent Office, dated Sep. 26, 2019, for International Patent Application No. PCT/EP2019/054788; 24 pages.

(Continued)

*Primary Examiner* — Diana J. Cheng
(74) *Attorney, Agent, or Firm* — Faegre Drinker Biddle & Reath LLP (57) ABSTRACT

An electronic power switch drive module for a power semiconductor unit, comprising a gate drive and a current transducer mounted on one or more circuit boards, the gate drive comprising at least one circuit portion for controlling at least one transistor of a power semiconductor module of said power semiconductor unit, the current transducer configured to be coupled to an output of the power semiconductor module for measuring an output current of the power semiconductor module, said at least one circuit portion connected to an output potential of the output current to be measured. The current transducer comprises at least one magnetic field sensor, the current transducer being con- (Continued)

nected to said at least one circuit portion of the gate drive at said output potential in a non-isolated manner.

25 Claims, 9 Drawing Sheets

(51) Int. Cl.
  *G01R 15/20* (2006.01)
  *H03K 17/90* (2006.01)
(52) U.S. Cl.
  CPC .......... *G01R 15/207* (2013.01); *H03K 17/90* (2013.01); *H03K 2217/0027* (2013.01)
(58) Field of Classification Search
  CPC .... G01R 15/20; G01R 15/183; G01R 15/186; G01R 15/205; H02M 2001/00; H02M 2001/0009; H03K 17/00; H03K 17/0828; H03K 17/90; H03K 19/00; H03K 19/00315; H03K 19/00361; H03K 19/00384; H03K 2217/00; H03K 2217/0027; H03K 17/082; H03K 17/08; H03K 17/002; H03K 17/005; H03K 17/007; H03K 17/0406; H03K 17/04; H03K 17/06; H03K 17/063; H03K 2017/066; H03K 17/042; H03K 17/0424; H03K 17/51; H04L 25/00; H04L 25/0272; H04L 25/028
  USPC .......................................................... 327/108
  See application file for complete search history.

(56) References Cited

U.S. PATENT DOCUMENTS

| | | | |
|---|---|---|---|
| 2016/0204597 A1* | 7/2016 | Hotta | H02M 1/088 307/131 |
| 2017/0019099 A1* | 1/2017 | Nam | H03K 17/567 |
| 2017/0162466 A1* | 6/2017 | Sawada | H01L 25/115 |
| 2017/0187367 A1* | 6/2017 | Rätz | H03K 17/082 |

FOREIGN PATENT DOCUMENTS

| | | |
|---|---|---|
| EP | 3118995 | 1/2017 |
| GB | 2283376 | 5/1995 |
| JP | 2017092670 | 5/2017 |
| JP | 2017158407 | 9/2017 |

OTHER PUBLICATIONS

"HOKA: a new isolated current measuring principle and its features" Karrer N. et al., vol. 3, Oct. 3, 1999, pp. 2121-2128; 8 pages.

\* cited by examiner

ELECTRONIC POWER SWITCH DRIVE MODULE

CROSS-REFERENCE TO RELATED APPLICATIONS

The present application is a national stage entry of International (PCT) Patent Application Number PCT/EP2019/054788, filed Feb. 27, 2019, which in turn claims priority to European Patent Application No. EP18159316.1, filed Feb. 28, 2018, the subject matter of which are expressly incorporated herein by reference.

The present invention relates to a power semiconductor unit and an electronic power switch drive module therefor.

In power electronics, electronics switches are used to make and to break electrical connections in circuit arrangements such as half bridges, anti-parallel or series connected switches or simply to connect a load to a power source, for instance applying periodical switching with frequency ranges from hundreds of Hertz to millions of Hertz. Electronic to switches for power semiconductor units include IGBTs (insulated gate bipolar transistor), FETs (Field Effect Transistor), MOSFETs (Metal Oxide Semiconductor Field Effect Transistor), and various known semiconductor switches that can be arranged in topologies such as a half bridge, three level, matrix and other such semiconductors switch configurations.

For many power semiconductor units, it is advantageous to have a very fast switching in order to reduce the transition time between on and off states where losses occur. In order to obtain fast switching times, power semiconductor units are typically provided with gate drive circuits which may include additional functions such as electrical insulation and bidirectional communication through an insulation barrier: Such circuits are typically known as gate drive units (GDU) for semiconductor components such as MOSFETs and IGBTs, whereby the gate drive supplies pulse shaped current waveforms in order to obtain switching times in a range of tenths of microseconds down to nanoseconds for state of the art technology using semiconductors such as SiC or GaN. Gate drive units may also perform other functions such as protection against overcurrent. This function can be obtained by measuring the voltage across the semiconductors which increases with higher currents. A fast current measuring transducer is advantageous because it is typically more stable over time and over typical operating temperature ranges, and allows switching devices to be operated closer to their known limits.

In conventional power semiconductor units, an isolated current transducer mounted downstream of the power semiconductor unit and measuring the current flowing in an output conductor of the device may be installed. The current transducer is isolated from the power semiconductor unit and may be connected to a control unit of the power semiconductor unit. The provision of an isolated current transducer mounted downstream of the power semiconductor unit increases manufacturing and installation costs. It is also known to connect a measuring shunt resistor to the supply voltage of a gate drive. A measuring shunt resistor however causes energy dissipation and possible thermoelectric offset depending on the range of output voltages. Resistive shunts may also have poor frequency response due to parasitic mutual inductances.

In view of the foregoing it is an objective to this invention to provide an electronic power switch drive module for a power semiconductor unit that is reliable, accurate, and enables fast semiconductor switching times.

It is advantageous to provide an electronic power switch drive module for a power semiconductor unit that is economical to produce and use.

It is advantageous to provide an electronic power switch drive module for a power semiconductor unit that has low energy dissipation.

It is advantageous to provide an electronic power switch drive module for a power semiconductor unit that can operate over a wide range of frequencies.

It is advantageous to provide an electronic power switch drive module for a power semiconductor unit that can operate at very high frequencies.

It is advantageous to provide an electronic power switch drive module for a power semiconductor unit that enables fast overcurrent protection.

Objects of this invention have been achieved by providing an electronic power switch drive module for a power semiconductor unit according to claim 1.

Objects of this invention have been achieved by providing an electronic power switch drive module for a power semiconductor unit according to claim 15.

Objects of this invention have been achieved by providing an electronic power switch drive module for a power semiconductor unit according to claim 17.

Disclosed herein is an electronic power switch drive control module for a power semiconductor unit, comprising an electronic power switch drive and a current transducer mounted on one or more circuit boards. The electronic power switch drive comprises at least one circuit portion for controlling at least one electronic power switch of a power semiconductor module of said power semiconductor unit. The current transducer is configured to be coupled to an output of the power semiconductor module for measuring an output current of the power semiconductor module, said at least one circuit portion connected to an output potential (Vout) of the output current to be measured.

According to first aspect of the invention, the current transducer comprises at least one magnetic field sensor, the current transducer being connected to said at least one circuit portion of the electronic power switch drive at said output potential in a non-isolated manner, said at least one circuit portion comprising a control logic circuit (20$f$) configured for connection to a control board (9) of said power semiconductor module (3), a measurement output signal of the the current transducer being fed into the control logic circuit.

According to a second aspect of the invention, the current transducer comprises at least one magnetic field sensor, the current transducer being connected to said at least one circuit portion of the electronic power switch drive at said output potential in a non-isolated manner, wherein the electronic power switch drive module comprises a circuit board on which both the gate drive circuit and current transducer are mounted and interconnected, said circuit board configured to be mounted directly on the power semiconductor module between input terminals and output terminals of the semiconductor module.

According to a third aspect of the invention, the current transducer comprises a plurality of discrete magnetic field sensors mounted on a portion of a circuit board surrounding a passage formed in the circuit board configured for receiving therethrough the output conductor, the current transducer being connected to said at least one circuit portion of the electronic power switch drive at said output potential in a non-isolated manner.

In an advantageous embodiment, the electronic power switch drive is a transistor gate drive and the at least one electronic power switch is a transistor.

In an advantageous embodiment, the current transducer comprises a passage formed in a current transducer portion of said one or more circuit boards, the passage configured for extension of an output conductor of the power semiconductor module therethrough.

In an advantageous embodiment, a Rogowski coil is formed on said current transducer portion of the one or more circuit boards surrounding said passage.

In an advantageous embodiment, the current transducer comprises at least one discrete magnetic field sensor mounted on a current transducer portion of the one or more circuit boards.

In an advantageous embodiment, the current transducer comprises a plurality of discrete magnetic field sensors mounted on a portion of the circuit board surrounding a passage formed in the portion circuit board configured for receiving therethrough the output conductor.

In an embodiment, at least one of the said discrete magnetic fields sensors is a magnetic field gradient sensor.

In an advantageous embodiment, the discrete magnetic field sensor may be a Hall effect sensor.

In an advantageous embodiment, the current transducer comprises a signal processing circuit connected to the Rogowski coil magnetic field sensor and to the discrete magnetic field sensors, the signal processing circuit combining the signal of the Rogowski magnetic field sensor and the discrete magnetic field sensors for generating a measurement signal of the output current.

In an advantageous embodiment, the electronic power switch drive module comprises a single circuit board on which both the gate drive circuit and current transducer are mounted.

In an advantageous embodiment, the electronic power switch drive module may comprise connection studs for connecting the electronic power switch drive module to the power semiconductor module.

In an advantageous embodiment, the electronic power switch drive module may comprise a signal or data communication interface for connection to a control unit of the power semiconductor unit.

In an advantageous embodiment, at least one circuit portion comprises a local protection circuit connected to an output of the current transducer, the local protection circuit connected to drive circuits of transistors of the power semiconductor module.

In an advantageous embodiment, the gate drive circuit comprises an isolated connection to an interface circuit for data, power or both data and power connection to the power semiconductor module.

Also disclosed herein is a power semiconductor unit comprising an electronic power switch drive module as set forth above, and a power semiconductor module, the electronic power switch drive module being mounted on the power semiconductor module.

In an advantageous embodiment, the power semiconductor unit may comprise direct to current input terminals on one end of the power semiconductor unit and output terminals arranged on an opposite end of the power semiconductor unit, the electronic power switch drive module being mounted on the power semiconductor module between the input terminals and output terminals.

In an embodiment, the power semiconductor unit is an IGBT device.

Further objects and advantageous features of the invention will be apparent from the claims and the following detailed description of embodiments of the invention in relation to the annexed drawings in which:

FIG. 3b is a simplified schematic perspective view of a portion of a power semiconductor unit comprising the electronic power switch drive module of FIG. 3a;

Referring to the figures, a power semiconductor unit 1 comprises a power semiconductor module 3 and an electronic power switch drive module 2 mounted and connected to the power semiconductor module.

The power semiconductor module 3 may for instance be in the form of an insulated gate bipolar transistor (IGBT) half bridge module, comprising a power input 5 and a power output 7. The power input 5 may comprise input DC (direct current) terminals 5a−, 5a+ for connection to positive and negative conductors of a direct current supply. The power output 7 comprises at least one output terminal 7a for at least one phase of an alternating voltage current. The waveform of the output current may have various shapes frequencies and amplitudes depending on the intended application for the power semiconductor unit. The power semiconductor unit may be implemented for use for instance in inverters for motor drives, inverters for grid connected photovoltaic plants, frequency converters for wind turbines and other power semiconductor applications.

The power semiconductor module may have two, three or more output terminals for a plurality of output phases.

The input and output terminals may each be provided with a conductive pad and a threaded connection for a clamping bolt connection to a corresponding input or output conductor. The output conductor may for instance be in a form of a bus bar 11 that is bolted to the corresponding output terminal 7a. Other known interconnection means may be used such as clamping terminals, welding, soldering, plug and socket, and other per se known connection systems.

Figure 1:
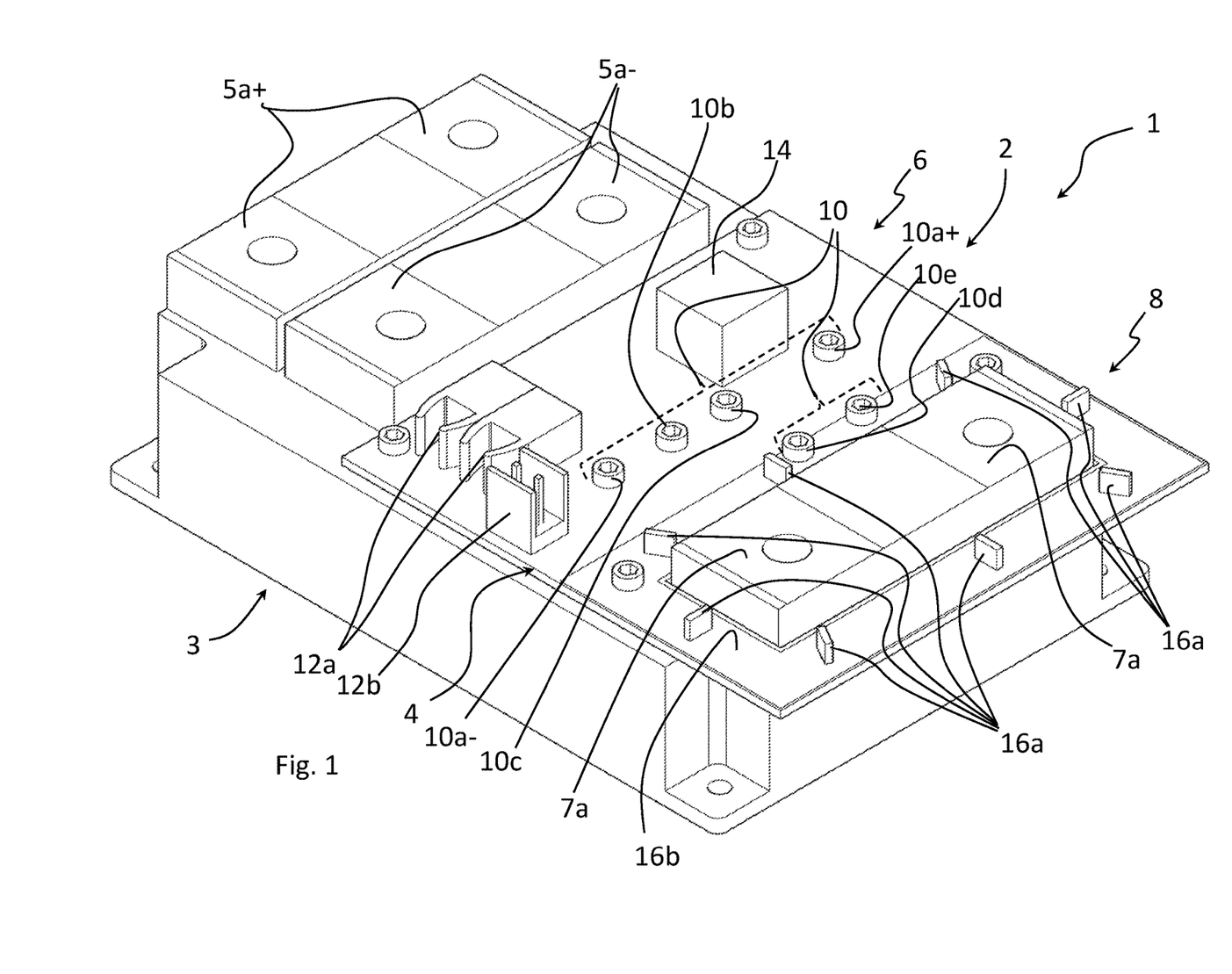
FIG. 1 is a simplified schematic perspective view of a power semiconductor unit (with an insulation covering removed) with an electronic power switch drive module according to an embodiment of the invention.
Figure 2:
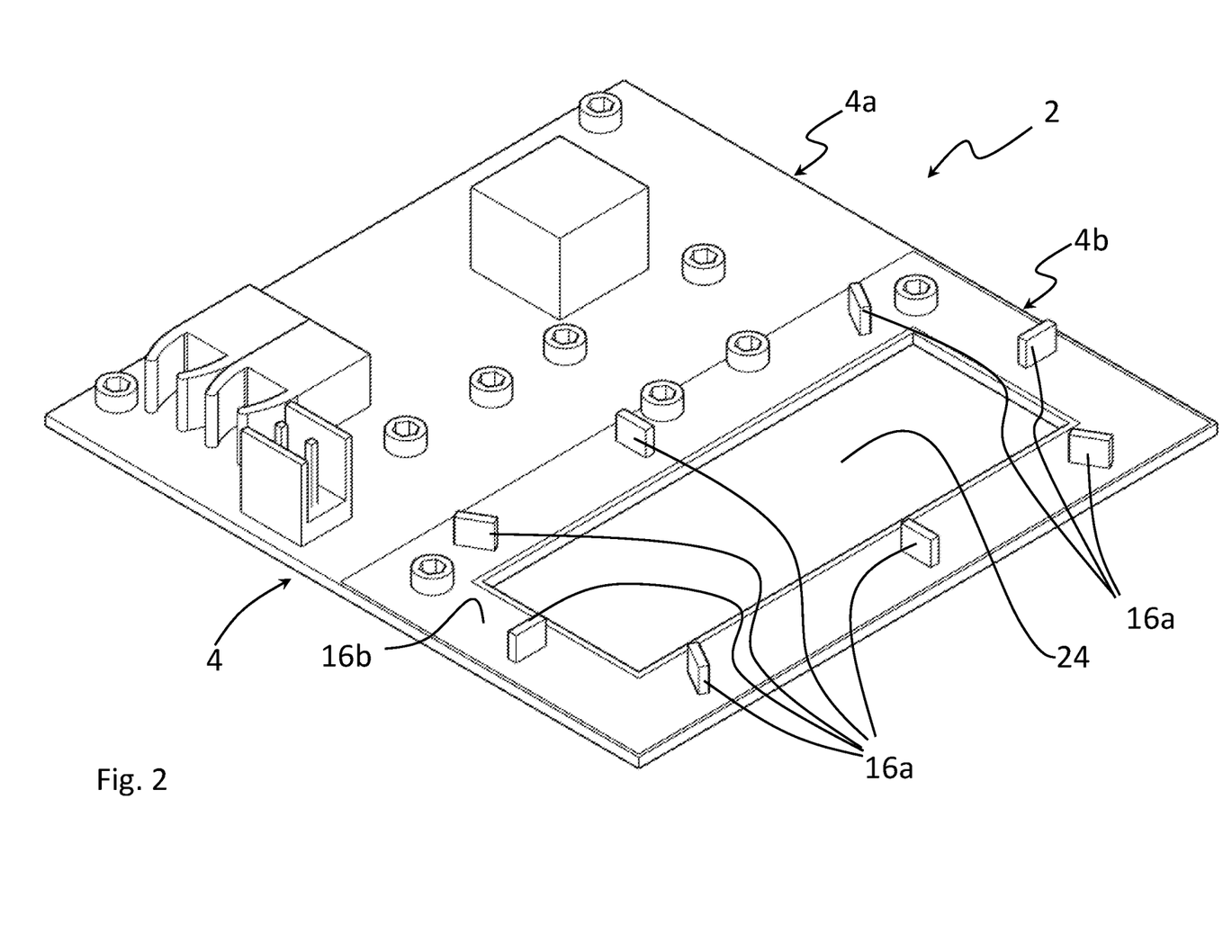
FIG. 2 is a simplified schematic perspective view of an electronic power switch drive module of the embodiment of FIG. 1.

The electronic power switch drive module 2 comprises a gate drive 6 and a current transducer 8. The electronic power switch drive module 2 comprises at least one circuit board 4. The gate drive 6 and current transducer 8 are mounted on said at least one circuit board 4. The circuit board 4, or more than one circuit board 4, comprises a gate drive portion 4a and a current transducer portion 4b. In the illustrated embodiments, the current transducer portion 4b comprises an output conductor passage 24 through which the conductor of the power output 7 extends through. The passage 24 may be completely formed within the circuit board (as illustrated) or may only be partially surrounded (not shown) by the circuit board, for instance the circuit board may comprise a slot extending from an edge of the circuit board that forms the passage, such that the circuit board partially surrounds the passage. In the embodiments of FIGS. 1 and 2, the output terminals 7a of the power output 7 extend through the passage 24 whereas in the embodiment of FIGS. 3a to 3c the bus bar 11 extends through the passage 24. Generally, the output conductor extends through the passage 24 such that a magnetic field induced by the current flowing through the output conductor may be captured by a magnetic field sensor mounted on the circuit board 4 adjacent and/or surrounding the passage 24. It may be noted that the Rogowski coil sensor is best implemented surrounding the output conductor, but the discrete magnetic field sensors may be in an arrangement that is not surrounding the output conductor. The Rogowski coil sensor preferably surrounds the output conductor fully, forming an essentially closed configuration around the output conductor. In variants the rogowski coil may surround the output conductor partially, for instance if the passage is formed as a slot or indent extending from an edge of the circuit board, the Rogowski coil formed on the circuit board surrounds the output conductor partially.

It may be noted that power semiconductor modules within the scope of the invention include electronic switching devices other than IGBTs (even though these are the most common today). In this regard, the electronic power switch may be a transistor, a thyristor, or other per se known electronic power switches. The use of the term "gate" herein thus includes the conventional meaning of a transistor gate, but in the more general context of an electronic power switch is intended to take the meaning of the control input of the switch. A gate driver should thus be understood more generally as an electronic power switch driver circuit.

The gate drive 6 comprises a circuit with circuit components that executes one or more, or all, of the following functions:

Receive a signal from the control unit to turn on or off the switch within a given time Control the rise and fall times of the output voltage to comply both with constraints on power dissipation and EMI (electromagnetic interference)

Provide fast protection of the power semiconductor switch

Identify desaturation events by monitoring the voltage across the switch (e.g. VCE for IGBT)

Identify overload events by monitoring the output current

In cases where a Rogowski coil or other inductive system is used to achieve a high measurement bandwidth, this high bandwidth channel can be monitored with low latency by a local protection system to react quickly to an overload or short circuit event, as a replacement or complement or in combination with the desaturation measurement used to identify situations in which the switches need to be turned off quickly to avoid their destruction Provide status information to the control board to facilitate system level protection Monitor semiconductor switch die temperature e.g. integrated diodes Monitor DCB (direct copper bonded) substrate temperature e.g. through an NTC (Negative temperature coefficient) resistor Monitor whether local protection was triggered Monitor Local gate drive supply voltage Monitor Switching delay, by monitoring the voltage and current response to the gate drive command Provide information to enable condition monitoring and predictive maintenance Perform closed loop control of the gate drive waveform to control the output current waveform, e.g. to match the switching characteristics of paralleled modules Perform closed loop control of the gate drive waveform to control the slope of the output voltage to fulfill EMI and switching loss requirements Provide local communication to other gate drive units in the same switching "sub-unit" (the switches in a half bridge, 3 level switch, matrix, must act in concert to ensure proper operation, e.g. prevent shoot through by enforcing safeguards like dead-time.

Implement the output side of an isolated power supply to power the GDU and current transducer.

These functions may advantageously be effected on a single circuit board 4 or a single circuit board portion. The connection between the gate drive 6 and the power semiconductor module 3 is provided via internal connections 10 that may include DC negative and positive connections 10a−, 10a+, an NTC connection 10b, a low side gate connection 10c, a high side emitter connection 10d, and a high side gate connection 10e. The internal connections may advantageously be provided in the form of conductive studs or bolts that ensure accurate spacing of the circuit board relative to the power semiconductor module and good electrical contact therebetween in a robust assembly. Other per se known connection techniques between the circuit board 4 and terminals of the power semiconductor module 3 may however be employed within the scope of the invention, for instance via soldered or welded contacts, spring contacts, press fit contacts and other per se known connection systems.

In order to reduce creepage distances and clearances, the circuit board 4 may be overmolded or partially overmolded with an insulating material, for instance overmolded with injection or transfer molding processes to cover surface areas of the circuit board provided with conductor traces and active circuit components in a thermoplastic or thermosetting polymer. The insulating material may also comprise a potting material filled over the circuit board or portions thereof.

The electronic power switch drive module further comprises external connectors 12 for connection to external components, for instance a signal connector 12a and a power supply connector 12b.

Figure 5:
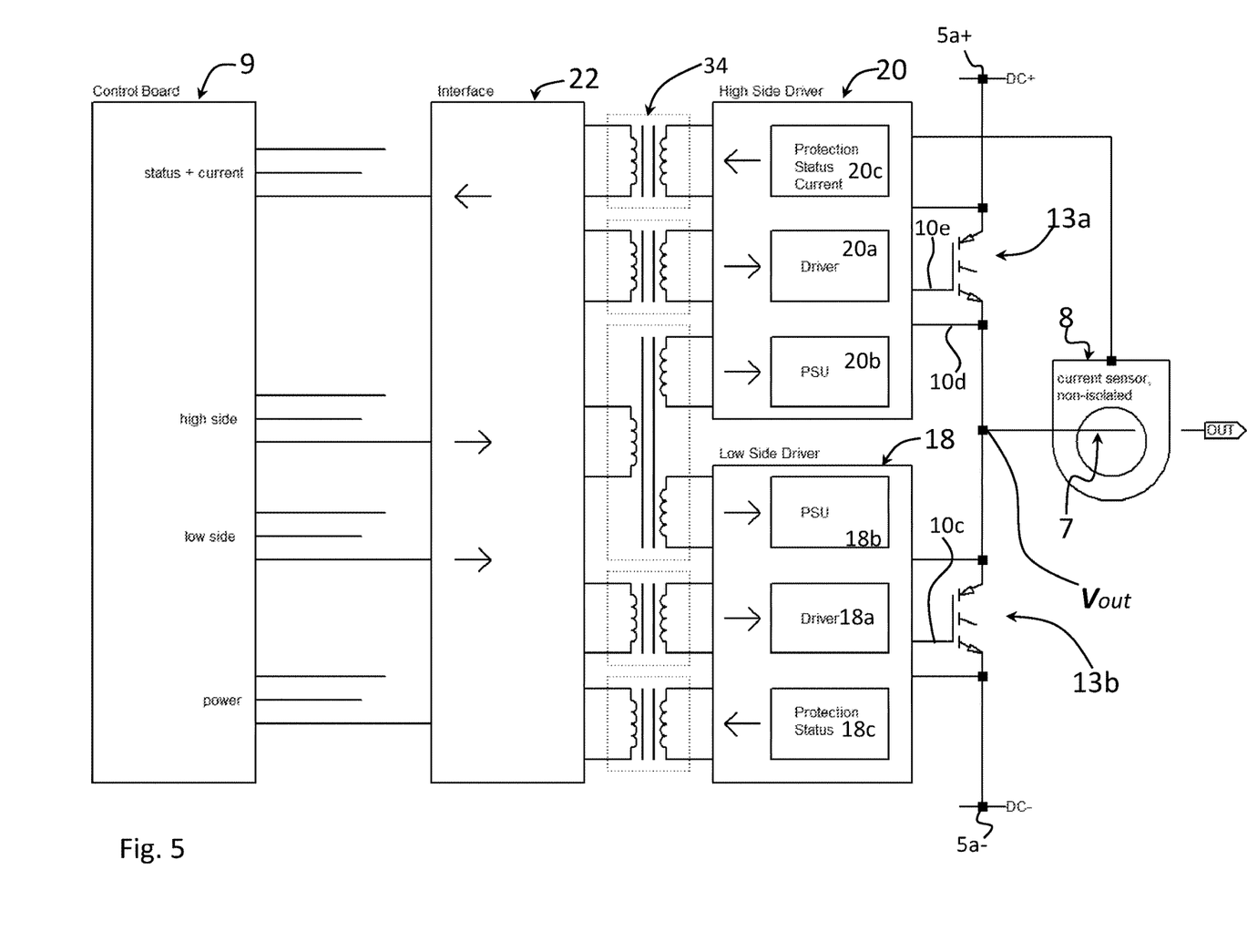
FIG. 5 is a simplified block circuit diagram of a power semiconductor unit with an electronic power switch drive module according to an embodiment of the invention.

As best illustrated in FIG. 5, the gate drive 6 may comprise a high side drive circuit 20 and the low side drive circuit 18 connected by an interface circuit 22 to a semiconductor device control board 9 of the power semiconductor module 3 via the internal connections 10.

The high side drive circuit and low side drive circuit may advantageously be connected to the interface circuit 22 via an isolated connection 34.

In an embodiment illustrated in FIG. 5, the high side drive circuit and low side drive circuit are connected to the interface 22 via inductive isolated connections 34a. Inductive isolation serves to transfer power to supply the isolated gate driver, and transfer information. Power transfer can be achieved by applying an AC voltage, in a frequency range from several kHz to several MHz, to the terminals of the primary winding of the transformer. One or several mutually isolated secondary windings can be magnetically coupled to the same primary winding, and the AC voltages appearing on the secondary side can then be rectified, filtered and regulated to produce the required DC voltages to supply the gate drive electronics.

Within the interface 22, the electronics generating the AC voltage can provide sufficient current to transfer the power required for the gate drive operation, often several Watts. The information to be transferred can be either sampled digital data, or continuous time digital data, e.g. when changing the state of a switch. The information transfer may also be based on applying an AC voltage to the primary winding, but characteristics of the AC waveform are modulated to convey information, such as the timing of a pulse edge, or the amplitude, frequency, duty cycle or phase of a pulse sequence. The modulation scheme may also have provisions to apply voltages with the sole purpose of maintaining zero average voltage at the inductor terminal. It is also possible to use a given inductively coupled circuit for to bidirectional communication, e.g. in a half-duplex scheme where each side uses the same transformer alternatively, or in a sequence depending on the information transmitted. In all cases, the inductively coupled devices may be transformers with wirewound coils and magnetic cores or transformers with windings realized as PCB traces, either in the PCB of the GDU or on a separate PCB, with or without magnetic material.

Figure 6:
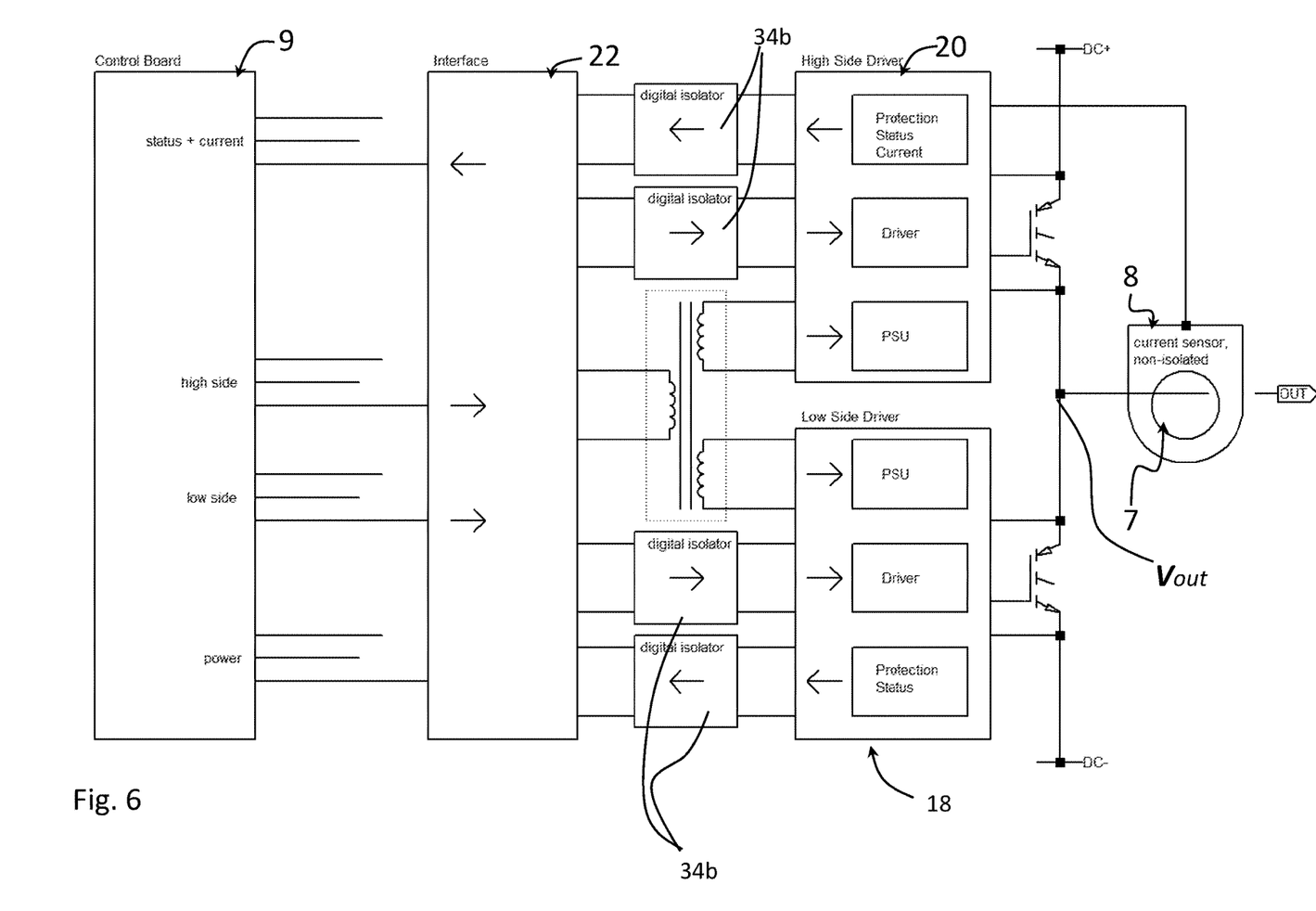
FIG. 6 is a simplified block circuit diagram of a power semiconductor unit with an electronic power switch drive module according to another embodiment of the invention.
Figure 7:
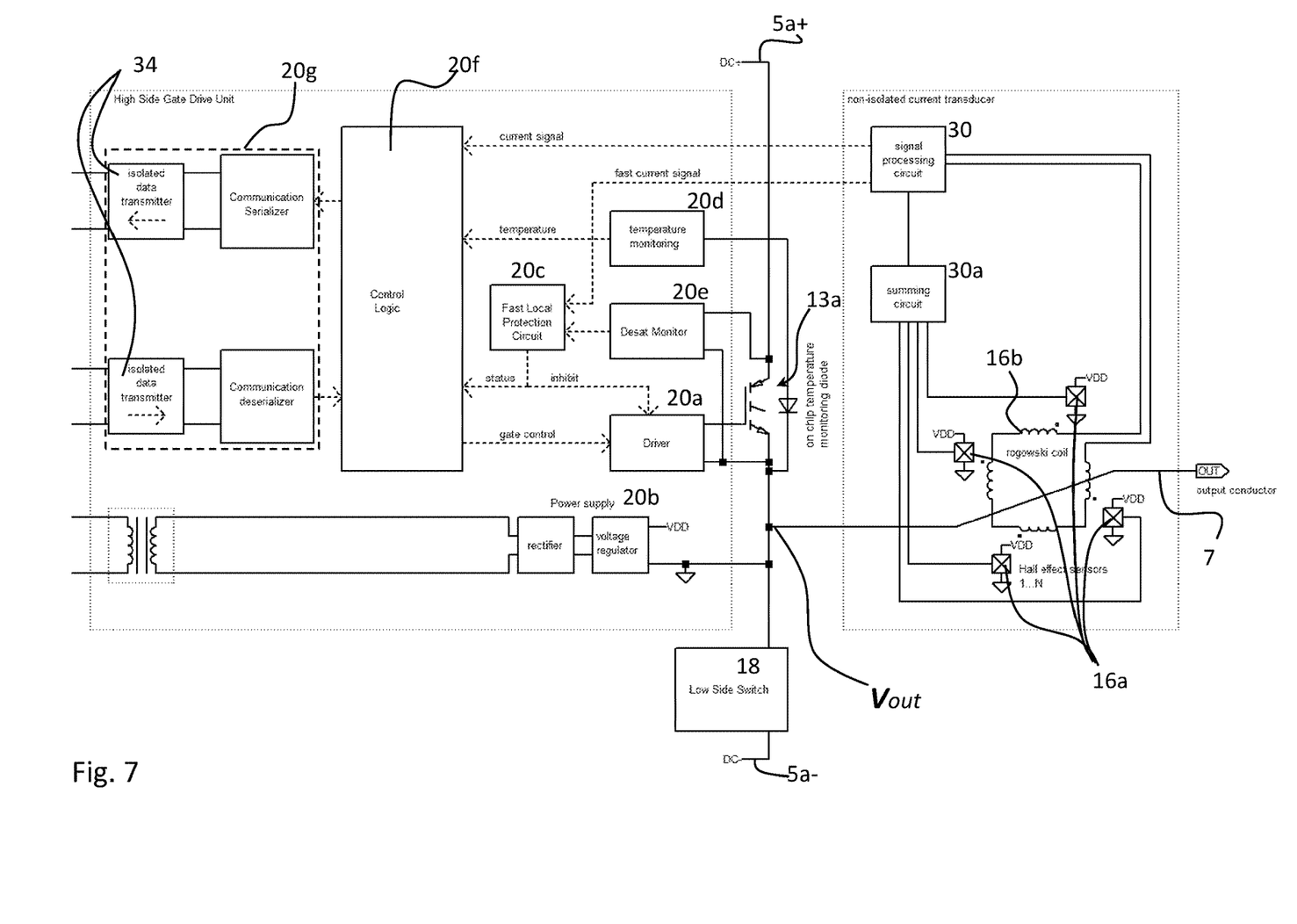
FIG. 7 is a more detailed circuit diagram of an electronic power switch drive module for a power semiconductor unit, according to an embodiment of the invention.

In a variant illustrated in FIG. 6, the high side drive circuit and low side drive circuit are connected to the interface 22 via digital isolated connections 34b. While isolated power transmission is preferably realized inductively, isolated transmission of information can be realized practically with several other means in addition to inductive isolation, like optical isolation, capacitive isolation.

The high side drive circuit 20 comprises a gate drive circuit portion 20a driving a gate of the high side transistor 13a, a power supply unit (PSU) 20 and a local protection circuit 20c. The high side circuit portion 20 may further comprise a temperature monitoring circuit 20d and a desaturation monitoring circuit 20e to measure desaturation between the collector and emitter of the transistor 13a. The desaturation monitoring circuit may be connected to the local protection circuit 20c to signal a desaturation of the transistor 13a.

A signal from the current transducer 8 and the local protection circuit 20c may be fed into a control logic circuit 20f that is connected via a communication circuit 20g to a control board 9 of the power semiconductor module.

In the illustrated embodiments, the low side circuit portion 18 and high side circuit portion 20 are related to two-level inverters, however the invention also applies to multi-level inverters greater than two levels, whereby the lowest switch would correspond to a "low side switch" of a two level inverter, and the other switches may be considered to be on the high side, forming "high side switches" since their gate drive needs to well insulated against high dv/dt changes because their emitters are not at a constant potential. In a two or greater level inverter, there is a "high side" switch having its emitter connected to an output potential Vout at which the output current is being measured. In the present invention, the current transducer is thus connected to at least one circuit portion of the gate drive connected to the output potential Vout at which the output current is being measured, in a non-isolated manner.

In the embodiments illustrated, the current transducer 8 comprises at least one magnetic field sensor 16a, 16b arranged to measure a magnetic field induced by the output current.

In an advantageous embodiment, the current transducer comprises a plurality of magnetic field sensors 16a, 16b. The plurality of magnetic field sensors may advantageously include a Rogowski coil sensor 16b mounted around the output conductor 7, either around the output terminals 7a as illustrated in the embodiment of FIG. 3b or around the output conductor such as the output bus bar 11 as illustrated in the embodiment of FIG. 4. The Rogowski coil sensor 16b may comprise conductive circuit traces within or on the circuit board surrounding the passage 24. In a preferred embodiment, the circuit traces form a Rogowski coil that fully or substantially fully surrounds the passage 24.

The current transducer 8 may further advantageously comprise one or a plurality of discrete magnetic field sensors 16a, for instance in a form of Hall effect sensors, mounted on the circuit board. The one or more discrete magnetic field sensors 16a mounted on the circuit board 4, and the Rogowski coil sensor 16a, allow the current transducer to have a wide frequency operating range and also enables high speed detection of an overload or fault.

In the embodiment illustrated in FIG. 2, a plurality of discrete magnetic field sensors 16a are mounted around the output conductor passage 24 in a spatially distributed manner, preferably in a substantially evenly distributed manner, to reduce the influence of external fields (compared to a magnetic field sensor that is not positioned in a distributed manner around the central passage) while amplifying the measurement signal. The current transducer may have two sensors, one on opposite sides of the output conductor, but preferably the current transducer comprises at least four, more preferably six, eight or more spaced apart and substantially evenly distributed discrete magnetic field sensors around the output conductor passage 24.

Figure 3A:
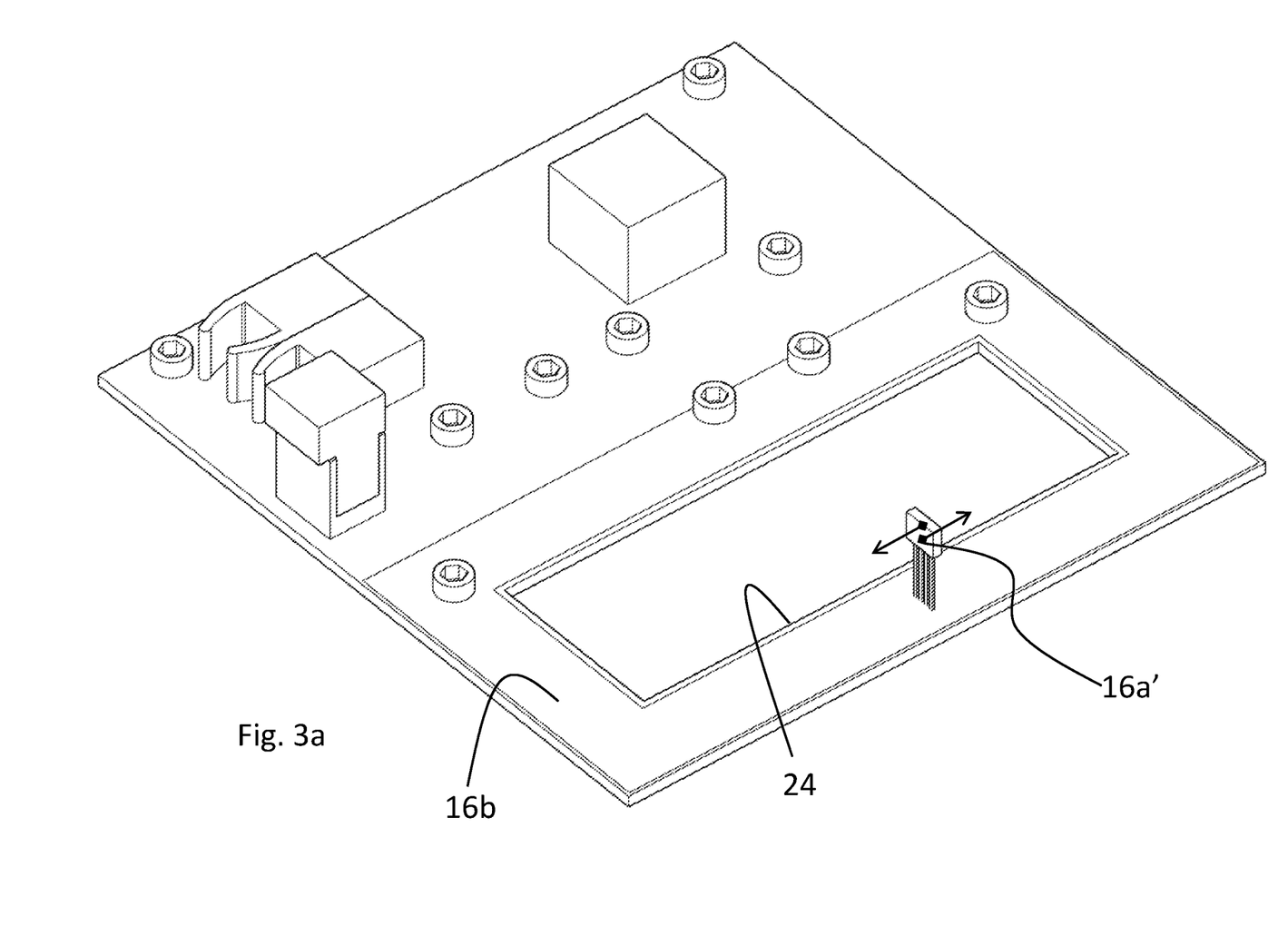
FIG. 3a is a simplified schematic perspective view of an electronic power switch drive module according to another embodiment of the invention.
Figure 3B:
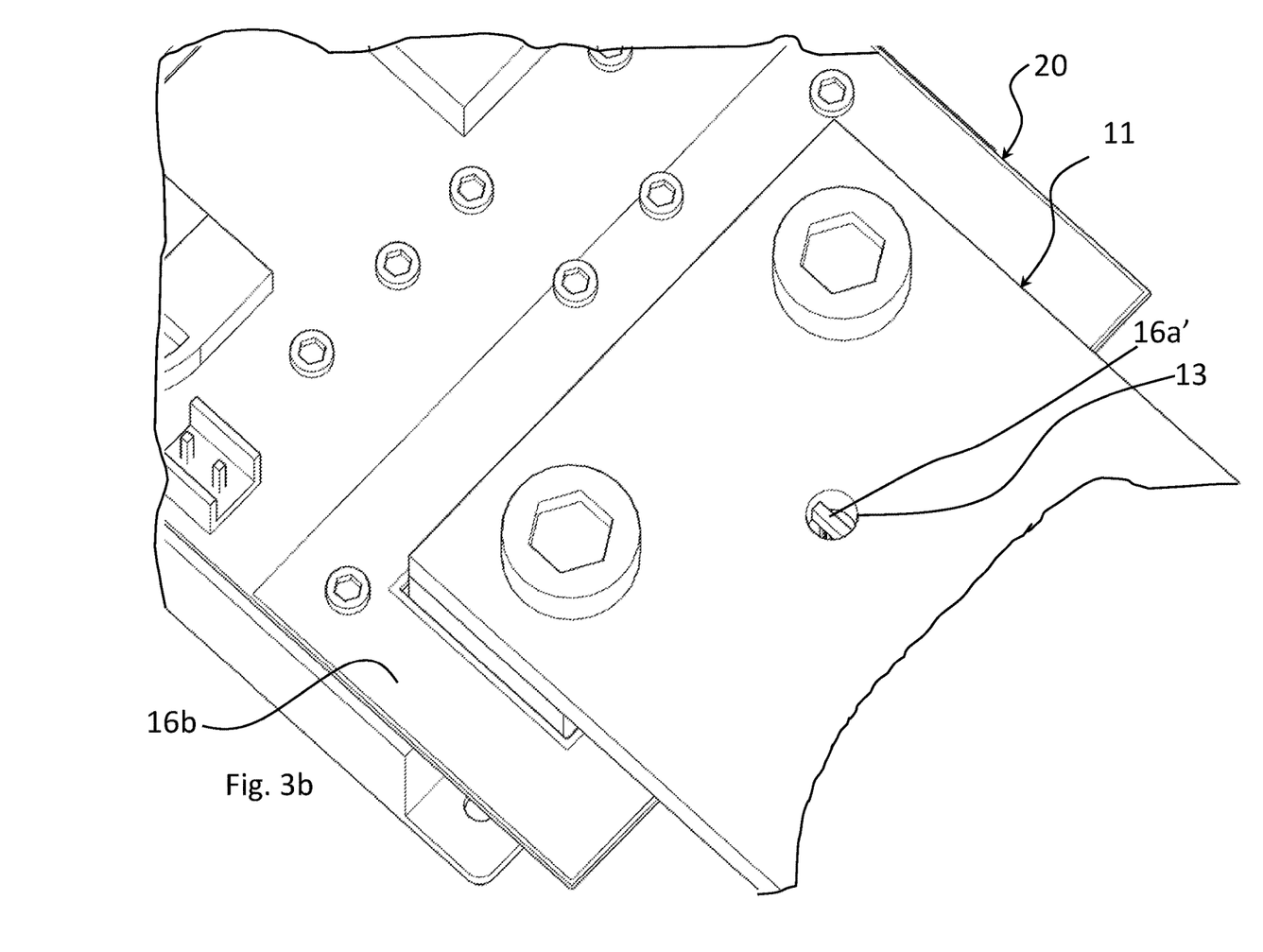
Figure 3C:
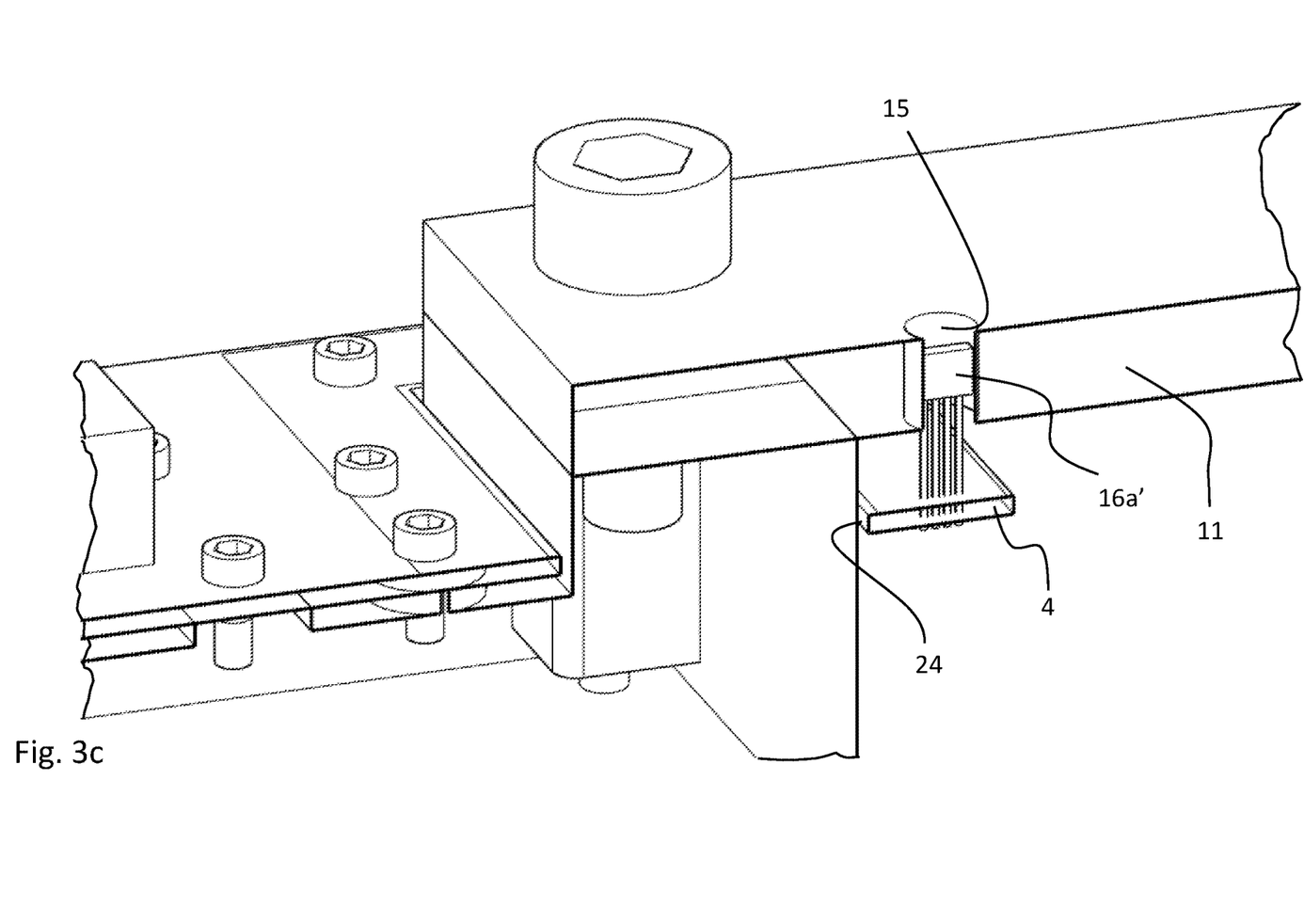
FIG. 3c is a simplified schematic perspective cross sectional view of the embodiment of FIG. 3b.
Figure 4:
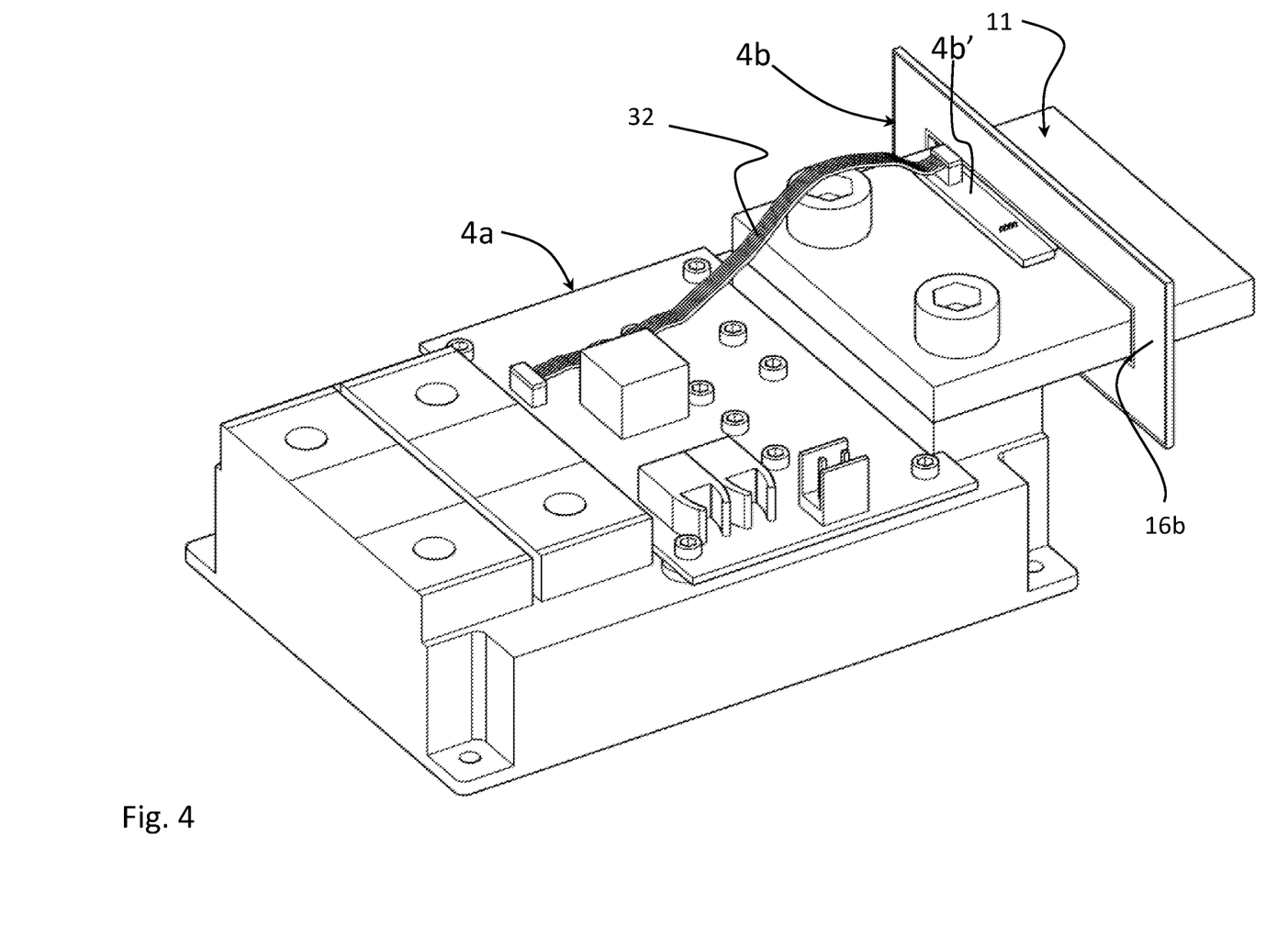
FIG. 4 is a simplified schematic perspective view of a power semiconductor unit with an electronic power switch drive module according to another embodiment of the invention.

As illustrated in the FIGS. 3a to 3c, in a variant, the discrete magnetic field sensor may comprise a magnetic field gradient sensor that is inserted in a cavity or orifice 15 in the output conductor 11. The magnetic field gradient sensor may for instance comprise or consist in a pair of oppositely arranged Hall sensors configured to measure a gradient of the magnetic field generated by the output current flowing in the output conductor. The functioning principle of a magnetic field gradient sensor to measure a primary current is per se known and shall not be further described herein.

In the illustrated embodiment, the magnetic field gradient sensor 16a' may advantageously be mounted on the circuit board 4 that is positioned below the bus bar 11 for a simple and economical assembly of the various components.

As illustrated in embodiment FIG. 4, the Rogowski coil 16b may be mounted on a circuit board portion 4b that is separate from the gate drive circuit board portion 4a, connected thereto for instance by a flexible connecting cable 32 or other form of electrical interconnect. In the illustrated embodiment of FIG. 4, the current transducer circuit board portion 4b is arranged orthogonal to the gate drive circuit board portion 4a, but the skilled person will appreciate that the circuit board portion 4b may be arranged parallel to the gate drive circuit board portion or at any other angle or disposition depending on the geometry of the output conductor arrangement. In the FIG. 4 illustrated embodiment, the separate circuit board portion 4b comprising the full current transducer, includes a main portion orthogonal to the gate drive circuit board portion 4a and a complementary circuit board portion 4b' orthogonal to the main portion 4b and carrying the discrete magnetic field sensor, for instance a gradient magnetic field sensor inserted in an orifice in the output conductor bar 11. In a variant, the discrete magnetic field sensors may be mounted on the circuit board portion 4b, surrounding the output conductor bar 11.

The Rogowski coil magnetic field sensor 16b and discrete magnetic field sensor(s) 16a, 16a' may be interconnected to a signal processing circuit 30 for generating a measurement of the output current from one or both of the current sensors as function of the operating frequency and/or current amplitude. A plurality of discrete magnetic field sensors 16a may be connected to a summing circuit 30a, as is per se known in the art, to generate the measurement of the magnetic field representative of the output current. The output signals of the plurality of discrete magnetic field sensors may be processed for instance to generate a weighted sum corresponding to a signal proportional to the measured current.

Advantageously, the current transducer combined with the gate drive in an electronic power switch drive module directly connected to the power semiconductor module enables a fast and low loss control of the semiconductor power device with feedback from the output. The non-isolated current transducer within the electronic power switch drive modules reduces the number of components (compared to an external current transducer) and removes the need for isolation, whereby the current transducer may be supplied with the same power supply as the high side drive of the electronic power switch drive module. Direct integration of the current transducer within the drive control unit also enables very fast response in case of fault or overload thus forming excellent overcurrent protection.

It may be noted that the magnetic field detectors employed within the scope of the invention may comprise various magnetic field sensors and combinations of magnetic field sensors such as fluxgate and magnetoresistive sensors, and may include soft magnetic elements to concentrate or change the direction of impinging magnetic fields. Such magnetic elements may be realized as macroscopic parts placed at the PCB level, or integrated in a package, or realized with a wafer level process as integrated magnetic concentrators. The magnetic field sensors may include systems to operate with a local feedback coil resulting in near zero flux operation to compensate for sensitivity variations and nonlinearities. The field magnetic sensors may measure the magnetic field in a direction perpendicular to the plane of the substrate or parallel to the plane of the substrate, and be mounted accordingly in packages to be soldered on a PCB, or as semiconductor dies embedded inside a the PCB.

The isolated transmission of the current measurement data to the power semiconductor unit control board may implement inductive, capacitive, radio, or optical transmission technologies, and can be either a dedicated isolator carrying only this information or a take place over an isolator used to transmit a combination of data back to the control unit. This information can include gate supply voltage, VCE, status of protection circuits, current, temperatures (e.g. if temperature is available per chip in addition of per IGBT module). Various information and data may be combined (e.g. into a frame) and transmitted over a single isolated channel. This combination may be performed by a logic circuit, e.g. a microcontroller, DSP, FPGA or CPLD, that may perform this and other functions associated with the gate drive unit.

Advantages of the proposed invention include:
low dissipation
good frequency response (compared to di/dt component in low value shunts caused by parasitic mutual inductances)
no thermoelectric offset (compared to shunt resistors with low full scale output voltage)
no magnetic core losses, no hysteresis, low mass
for the magnetic field gradient sensor variant: low consumption, low cost
for the combined magnetic field gradient sensor and full PCB Rogowski coil: avoid frequency response issues of pure gradient sensor due to skin and proximity effect resulting in frequency dependent changes in current density distribution, which result in varying magnetic coupling with the gradient sensor and changes in sensitivity Isolation (housing, potting) and countering dv/dt from the voltage swing of the output bus bar (e.g. in the form of shielding, differential transmission, receivers with high CM immunity) are cost drivers for a current transducer. Digital data transmission is however economical, and it is thus an advantage to combine the low insertion loss advantage of a magnetically coupled current transducer with the low isolation cost and elimination of dv/dt effects of digital isolation.

In addition, a Rogowski coil has a low power supply requirement, enabling a supply through the isolated gate driver power supply, making it easier to interconnect than previous separate transducer arrangements.

The combined gate drive and current transducer in a single device facilitates bus bar design, system design and enables system level cost savings for the power semiconductor unit.

Moreover, fast current measurement with a Rogowski coil sensor enables effective overcurrent protection schemes and closed loop control of transistor switching.

LIST OF REFERENCES

Power semiconductor unit 1
  (e.g. insulated gate bipolar transistor IGBT assembly)
  Semiconductor Module 3
  (e.g. IGBT half bridge module)
    Input 5
      Input DC terminals −ve, +ve 5a−, 5a+
    Output 7
      Output terminals 7a
    Bus bar 11
      Sensor Cavity 15
  Semiconductor device control board 9
  Electronic power switch 13a, 13b
  (e.g Transistor 13a, 13b)
Electronic power switch drive control module 2
  (e.g. Gate drive control module 2)
    Circuit board 4
      Electronic power switch drive portion 4a
      (e.g. Gate drive portion 4a)
      Current transducer portion 4b
      Output conductor passage 24
      Interconnection 32 (e.g. flex cable)
  Electronic power switch drive 6
  (e.g. Gate Drive 6)
    Internal connections 10
      DC −ve, +ve connections 10a−, 10a+
      NTC connection 10b
      Low side gate connection 10c
      High side emitter connection 10d
      High side gate connection 10e
    External connectors 12
      Signal connector 12a
      Power supply connector 12b

Circuit components
  Transformer 14
  Circuit portion(s) 18, 20
    First (e.g Low side) circuit portion 18
      Drive circuit 18*a*
      Power supply (PSU) 18*b*
      Local protection circuit 18*c*
    Second (e.g. High side) circuit portion 20
      Drive circuit 20*a*
      Power supply (PSU) 20*b*
      Local protection circuit 20*c*
      Temperature monitoring circuit 20*d*
      Desaturation monitoring circuit 20*e*
      Control logic circuit 20*f*
      Communication circuit 20*g*
        Transmitter (Serializer, isolated data transmitter)
        Receiver (Deserializer, isolated data transmitter)
      Connection isolator 34
        Digital connection isolator 34*b*
        Inductive connection isolator 34*a*
      Interface 22
  Current transducer 8
    Magnetic field Sensors
      Hall effect sensor 16*a*
        Gradient sensor 16*a*'
      Rogowski coil sensor (PCB Rogowski coil) 16*b*
      Signal processing circuit 30
        Summing circuit 30*a*

The invention claimed is:

1. An electronic power switch drive module for a power semiconductor unit, comprising an electronic power switch drive and a current transducer mounted on one or more circuit boards, the electronic power switch drive comprising a circuit with at least one circuit portion for controlling at least one electronic power switch of a power semiconductor module of said power semiconductor unit, the current transducer configured to be coupled to an output of the power semiconductor module for measuring an output current of the power semiconductor module, said at least one circuit portion connected to an output potential (Vout) of the output current to be measured, wherein the current transducer comprises at least one magnetic field sensor, the current transducer being electrically connected to said at least one circuit portion of the electronic power switch drive at said output potential, said at least one circuit portion comprising a control logic circuit configured for connection to a control board of said power semiconductor module, a measurement output signal of the current transducer being fed into the control logic circuit, and wherein said circuit of the electronic power switch drive comprises a galvanically isolated connection to an interface circuit for data, power or both data and power connection to the power semiconductor module.

2. The electronic power switch drive module according to claim 1, wherein said electronic power switch drive is a transistor gate drive and said at least one electronic power switch is a transistor.

3. The electronic power switch drive module according to claim 2 wherein the transistor gate drive comprise a high side drive circuit and a low side drive circuit.

4. The electronic power switch drive module according to claim 3 wherein both the high side drive circuit and the low side drive circuit are connected to a semiconductor device control board of the power semiconductor module via galvanically isolated connections.

5. The electronic power switch drive module according to claim 1, wherein the current transducer comprises a passage formed in a current transducer portion of said one or more circuit boards, the passage configured for extension of an output conductor of the power semiconductor module therethrough.

6. The electronic power switch drive module according to claim 5, wherein a Rogowski coil is formed on said current transducer portion of the one or more circuit boards surrounding said passage.

7. The electronic power switch drive module according to claim 6, wherein the current transducer comprises a plurality of discrete magnetic field sensors mounted on a portion of the circuit board surrounding a passage formed in the portion of the circuit board configured for receiving therethrough the output conductor and wherein the current transducer comprises a signal processing circuit connected to the Rogowski coil magnetic field sensor and to the discrete magnetic field sensors, the signal processing circuit combining the signal of the Rogowski magnetic field sensor and the discrete magnetic field sensors for generating a measurement signal of the output current.

8. The electronic power switch drive module according to claim 1, wherein the current transducer comprises at least one discrete magnetic field sensor mounted on a current transducer portion of the one or more circuit boards.

9. The electronic power switch drive module according to claim 8, wherein the current transducer comprises a plurality of discrete magnetic field sensors mounted on a portion of the circuit board surrounding a passage formed in the portion of the circuit board configured for receiving therethrough the output conductor.

10. The electronic power switch drive module according to claim 8, wherein at least one of the said discrete magnetic fields sensors is a magnetic field gradient sensor.

11. The electronic power switch drive module according to claim 8, wherein the discrete magnetic field sensor is a Hall effect sensor.

12. The electronic power switch drive module according to claim 1, wherein the electronic power switch drive module comprises a single circuit board on which both the electronic power switch drive circuit and current transducer are mounted.

13. The electronic power switch drive module according to claim 1, comprising connection studs for connecting the electronic power switch drive module to the power semiconductor module.

14. The electronic power switch drive module according to claim 1, comprising a signal or data communication interface for connection to a control unit of the power semiconductor unit.

15. The electronic power switch drive module according to claim 1, wherein said at least one circuit portion comprises a local protection circuit connected to an output of the current transducer, the local protection circuit connected to the electronic power switch drive circuit of the power semiconductor module.

16. The electronic power switch drive module according to claim 1, wherein said galvanically isolated connection to said interface circuit for data, power or both data and power connection to the power semiconductor module, comprises an inductive galvanically isolated connection to transfer at least power.

17. A power semiconductor unit comprising an electronic power switch drive module according to claim 1, and a power semiconductor module, the electronic power switch drive module being mounted on the power semiconductor module.

18. The power semiconductor unit according to claim 17, comprising direct current input terminals on one end of the power semiconductor unit and output terminals arranged on an opposite end of the power semiconductor unit, the electronic power switch drive module being mounted on the power semiconductor module between the input terminals and output terminals.

19. The power semiconductor unit according to claim 18, wherein the power semiconductor unit is an IGBT device.

20. An IGBT power semiconductor unit comprising an electronic power switch drive module according to claim 17, and a power semiconductor module, the electronic power switch drive module being mounted on the power semiconductor module.

21. The IGBT power semiconductor unit according to claim 20, comprising direct current input terminals on one end of the power semiconductor unit and output terminals arranged on an opposite end of the power semiconductor unit, the electronic power switch drive module being mounted on the power semiconductor module between the input terminals and output terminals.

22. An electronic power switch drive module for a power semiconductor unit, comprising an electronic power switch drive and a current transducer mounted on one or more circuit boards, the electronic power switch drive comprising a circuit with at least one circuit portion for controlling at least one electronic power switch of a power semiconductor module of said power semiconductor unit, the current transducer configured to be coupled to an output of the power semiconductor module for measuring an output current of the power semiconductor module, said at least one circuit portion connected to an output potential (Vout) of the output current to be measured, wherein the current transducer comprises at least one magnetic field sensor, the current transducer being electrically connected to said at least one circuit portion of the electronic power switch drive at said output potential wherein the electronic power switch drive module comprises a circuit board on which both the electronic power switch drive circuit and current transducer are mounted and interconnected, said circuit board configured to be mounted directly on the power semiconductor module between input terminals and output terminals of the semiconductor module, and wherein said circuit of the electronic power switch drive comprises a galvanically isolated connection to an interface circuit for data, power or both data and power connection to the power semiconductor module.

23. An IGBT power semiconductor unit comprising an electronic power switch drive module according to claim 22, and a power semiconductor module, the electronic power switch drive module being mounted on the power semiconductor module.

24. The IGBT power semiconductor unit according to claim 23, comprising direct current input terminals on one end of the power semiconductor unit and output terminals arranged on an opposite end of the power semiconductor unit, the electronic power switch drive module being mounted on the power semiconductor module between the input terminals and output terminals.

25. An electronic power switch drive module for a power semiconductor unit, comprising an electronic power switch drive and a current transducer mounted on one or more circuit boards, the electronic power switch drive comprising at least one circuit portion for controlling at least one electronic power switch of a power semiconductor module of said power semiconductor unit, the current transducer configured to be coupled to an output of the power semiconductor module for measuring an output current of the power semiconductor module, said at least one circuit portion connected to an output potential (Vout) of the output current to be measured, wherein the current transducer comprises a plurality of discrete magnetic field sensors mounted on a portion of a circuit board surrounding a passage formed in the circuit board configured for receiving therethrough the output conductor, the current transducer being electrically connected to said at least one circuit portion of the electronic power switch drive at said output potential, and wherein said circuit of the electronic power switch drive comprises a galvanically isolated connection to an interface circuit for data, power or both data and power connection to the power semiconductor module.

* * * * *